(12) United States Patent
Yang et al.

(10) Patent No.: US 8,634,152 B1
(45) Date of Patent: Jan. 21, 2014

(54) SYSTEMS AND METHODS FOR THROUGHPUT ENHANCED DATA DETECTION IN A DATA PROCESSING CIRCUIT

(71) Applicant: LSI Corporation, Milpitas, CA (US)

(72) Inventors: Shaohua Yang, San Jose, CA (US); Changyou Xu, Fremont, CA (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/652,182

(22) Filed: Oct. 15, 2012

(51) Int. Cl.
*G11B 5/09* (2006.01)
(52) U.S. Cl.
USPC ............... 360/39; 360/55; 360/65; 360/67
(58) Field of Classification Search
None
See application file for complete search history.

(56) References Cited

U.S. PATENT DOCUMENTS

| | | | |
|---|---|---|---|
| 5,278,703 A | 1/1994 | Rub et al. | |
| 5,278,846 A | 1/1994 | Okayama | |
| 5,317,472 A | 5/1994 | Schweitzer, III | |
| 5,325,402 A | 6/1994 | Ushirokawa | |
| 5,392,299 A | 2/1995 | Rhines | |
| 5,417,500 A | 5/1995 | Martinie | |
| 5,513,192 A | 4/1996 | Janku | |
| 5,523,903 A | 6/1996 | Hetzler | |
| 5,550,810 A | 8/1996 | Monogioudis et al. | |
| 5,550,870 A | 8/1996 | Blaker | |
| 5,612,964 A | 3/1997 | Haraszti | |
| 5,710,784 A | 1/1998 | Kindred | |
| 5,717,706 A | 2/1998 | Ikeda | |
| 5,802,118 A | 9/1998 | Bliss | |
| 5,844,945 A | 12/1998 | Nam | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | McCallister | |
| 6,023,783 A | 2/2000 | Divsalar | |
| 6,029,264 A | 2/2000 | Kobayashi | |
| 6,065,149 A | 5/2000 | Yamanaka | |
| 6,097,764 A | 8/2000 | McCallister | |
| 6,145,110 A | 11/2000 | Khayrallah | |
| 6,216,249 B1 | 4/2001 | Bliss | |
| 6,216,251 B1 | 4/2001 | McGinn | |
| 6,266,795 B1 | 7/2001 | Wei | |
| 6,317,472 B1 | 11/2001 | Choi | |
| 6,351,832 B1 | 2/2002 | Wei | |
| 6,377,610 B1 | 4/2002 | Hagenauer | |
| 6,381,726 B1 | 4/2002 | Weng | |
| 6,473,878 B1 | 10/2002 | Wei | |
| 6,535,553 B1 | 3/2003 | Limberg et al. | |
| 6,625,775 B1 | 9/2003 | Kim | |
| 6,748,034 B2 | 6/2004 | Hattori | |
| 6,757,862 B1 | 6/2004 | Marianetti, II | |
| 6,785,863 B2 | 8/2004 | Blankenship | |
| 6,810,502 B2 | 10/2004 | Eidson | |
| 6,970,511 B1 | 11/2005 | Barnette | |

(Continued)

OTHER PUBLICATIONS

U.S. Appl. No. 13/426,714, Shaohua Yang

(Continued)

*Primary Examiner* — Muhammad E Edun
(74) *Attorney, Agent, or Firm* — Hamilton DeSanctis & Cha (57) ABSTRACT

Systems, methods, devices, circuits for data processing, and more particularly, and more particularly to data processing relying on efficiency improved data detection.

20 Claims, 6 Drawing Sheets

(56) References Cited

U.S. PATENT DOCUMENTS

| | | | |
|---|---|---|---|
| 6,986,098 | B2 | 1/2006 | Poeppelman |
| 7,047,474 | B2 | 5/2006 | Rhee |
| 7,058,873 | B2 | 6/2006 | Song et al. |
| 7,073,118 | B2 | 7/2006 | Greenberg |
| 7,093,179 | B2 | 8/2006 | Shea |
| 7,117,427 | B2 | 10/2006 | Ophir |
| 7,133,228 | B2 | 11/2006 | Fung et al. |
| 7,184,486 | B1 | 2/2007 | Wu |
| 7,191,378 | B2 | 3/2007 | Eroz et al. |
| 7,203,887 | B2 | 4/2007 | Eroz et al. |
| 7,308,061 | B1 | 12/2007 | Huang |
| 7,310,768 | B2 | 12/2007 | Eidson et al. |
| 7,313,750 | B1 | 12/2007 | Feng |
| 7,370,258 | B2 | 5/2008 | Iancu et al. |
| 7,415,651 | B2 | 8/2008 | Argon |
| 7,502,189 | B2 | 3/2009 | Sawaguchi |
| 7,523,375 | B2 | 4/2009 | Spencer |
| 7,587,657 | B2 | 9/2009 | Haratsch |
| 7,590,168 | B2 | 9/2009 | Raghavan |
| 7,646,829 | B2 | 1/2010 | Ashley |
| 7,702,986 | B2 | 4/2010 | Bjerke et al. |
| 7,752,523 | B1 | 7/2010 | Chaichanavong |
| 7,779,325 | B2 | 8/2010 | Song |
| 7,802,172 | B2 | 9/2010 | Vila Casado et al. |
| 7,952,824 | B2 | 5/2011 | Dziak et al. |
| 7,958,425 | B2 | 6/2011 | Chugg et al. |
| 7,996,746 | B2 | 8/2011 | Livshitz et al. |
| 8,018,360 | B2 | 9/2011 | Nayak |
| 8,074,055 | B1* | 12/2011 | Yates et al. ............... 712/43 |
| 8,201,051 | B2 | 6/2012 | Tan et al. |
| 8,201,064 | B2* | 6/2012 | Ferguson ............... 714/795 |
| 8,237,597 | B2 | 8/2012 | Liu et al. |
| 8,261,171 | B2 | 9/2012 | Annampedu |
| 8,291,284 | B2 | 10/2012 | Savin |
| 8,295,001 | B2 | 10/2012 | Liu et al. |
| 2008/0069373 | A1 | 3/2008 | Jiang et al. |
| 2008/0304558 | A1 | 12/2008 | Zhu et al. |
| 2009/0060197 | A1* | 3/2009 | Taylor et al. ............. 380/277 |
| 2009/0132893 | A1 | 5/2009 | Miyazaki et al. |
| 2009/0185643 | A1 | 7/2009 | Fitzpatrick et al. |
| 2011/0167227 | A1 | 7/2011 | Yang |
| 2011/0264987 | A1 | 10/2011 | Li |
| 2012/0124118 | A1 | 5/2012 | Ivkovic |
| 2012/0182643 | A1 | 7/2012 | Zhang |
| 2012/0207201 | A1 | 8/2012 | Xia |
| 2012/0212849 | A1 | 8/2012 | Xu |
| 2012/0262814 | A1 | 10/2012 | Li |
| 2012/0265488 | A1 | 10/2012 | Sun |
| 2013/0147643 | A1* | 6/2013 | Abali et al. ............... 341/60 |

OTHER PUBLICATIONS

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF($2^\wedge$ m) LDPC Decoders", IEEE Transactions on Circuits and Systemsŝi: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/227,544, Unpublished filed Sep. 8, 2011 Shaohua Yang.

U.S. Appl. No. 13/362,409, Unpublished filed Jan. 31, 2012 Fan Zhang.

U.S. Appl. No. 13/316,858, Unpublished filed Dec. 12, 2011 Zongwang Li.

U.S. Appl. No. 13/316,741, Unpublished filed Dec. 12, 2011 Yang Han.

U.S. Appl. No. 13/445,878, Unpublished filed Apr. 12, 2012 Yu Liao.

U.S. Appl. No. 13/327,279, Unpublished filed Dec. 15, 2011 Wei Feng.

U.S. Appl. No. 13/340,974, Unpublished filed Dec. 30, 2011 Dan Liu.

U.S. Appl. No. 13/445,848, Unpublished filed Apr. 12, 2012 Bruce Wilson.

U.S. Appl. No. 13/340,951, Unpublished filed Dec. 30, 2011 Lei Chen.

U.S. Appl. No. 13/369,468, Unpublished filed Feb. 9, 2012 Zongwang Li.

U.S. Appl. No. 13/269,852, Unpublished filed Oct. 10, 2011 Haitao Xia.

U.S. Appl. No. 13/284,730, Unpublished filed Oct. 28, 2011 Fan Zhang.

U.S. Appl. No. 13/295,150, Unpublished filed Nov. 14, 2011 Zongwang Li.

U.S. Appl. No. 13/412,520, Unpublished filed Mar. 5, 2012 Fan Zhang.

U.S. Appl. No. 13/269,832, Unpublished filed Oct. 10, 2011 Haitao Xia.

U.S. Appl. No. 13/283,549, Unpublished filed Oct. 27, 2011 Wu Chang.

U.S. Appl. No. 13/239,683, Unpublished filed Sep. 22, 2011 Changyou Xu.

U.S. Appl. No. 13/186,234, Unpublished filed Jul. 19, 2011 Haitao Xia.

U.S. Appl. No. 13/213,751, Unpublished filed Aug. 19, 2011 Fan Zhang.

U.S. Appl. No. 13/174,453, Unpublished filed Jun. 30, 2011 Johnson Yen.

(56) References Cited

OTHER PUBLICATIONS

U.S. Appl. No. 13/174,537, Unpublished filed Jun. 30, 2011 Anantha Raman Krishnan.
U.S. Appl. No. 13/296,022, Unpublished filed Nov. 14, 2011 Victor Krachkovsky.
U.S. Appl. No. 13/305,551, Unpublished filed Nov. 28, 2011 Yang Han.
U.S. Appl. No. 13/227,416, Unpublished filed Sep. 7, 2011 Lei Chen.
U.S. Appl. No. 13/305,510, Unpublished filed Nov. 28, 2011 Lei Chen.
U.S. Appl. No. 13/302,119, Unpublished filed Nov. 22, 2011 Lei Chen.
U.S. Appl. No. 13/597,026, Unpublished filed Aug. 28, 2012 Fan Zhang.
U.S. Appl. No. 13/300,078, Unpublished filed Nov. 18, 2011 Chung-Li Wang.
U.S. Appl. No. 13/180,495, Unpublished filed Jul. 11, 2011 Chung-Li Wang.
U.S. Appl. No. 13/284,767, Unpublished filed Oct. 28, 2011 Fan Zhang.
U.S. Appl. No. 13/415,326, Unpublished filed Mar. 8, 2012 Shaohua Yang.
U.S. Appl. No. 13/426,693, Unpublished filed Mar. 22, 2012 Shaohua Yang.
U.S. Appl. No. 13/483,105, Unpublished filed May 30, 2012 Xuebin Wu.
U.S. Appl. No. 13/597,001, Unpublished filed Aug. 28, 2012 Fan Zhang.
U.S. Appl. No. 13/483,100, Unpublished filed May 30, 2012 Fan Zhang.
U.S. Appl. No. 13/426,714, Unpublished filed Mar. 22, 2012 Shaohua Yang.
U.S. Appl. No. 13/415,430, Unpublished filed Mar. 8, 2012 Nayak Ratnakar Aravind.
U.S. Appl. No. 13/621,341, Unpublished filed Sep. 17, 2012 Shaohua Yang.
U.S. Appl. No. 13/113,219, Unpublished filed May 23, 2011 Yang Han.
U.S. Appl. No. 13/619,907, Unpublished filed Sep. 14, 2012 Fan Zhang.
U.S. Appl. No. 13/596,978, Unpublished filed Aug. 28, 2012 Fan Zhang.
U.S. Appl. No. 13/596,947, Unpublished filed Aug. 28, 2012 Fan Zhang.
U.S. Appl. No. 13/596,819, Unpublished filed Aug. 28, 2012 Shaohua Yang.
U.S. Appl. No. 13/545,833, Unpublished filed Jul. 10, 2012 Zhi Bin Li.
U.S. Appl. No. 13/433,693, Unpublished filed Mar. 29, 2012 Fan Zhang.
U.S. Appl. No. 13/474,660, Unpublished filed May 17, 2012 Zongwang Li.
U.S. Appl. No. 13/422,986, Unpublished filed Mar. 16, 2012 Fan Zhang.
U.S. Appl. No. 13/372,580, Unpublished filed Feb. 14, 2012 Fan Zhang.
U.S. Appl. No. 13/171,615, Unpublished filed Jun. 29, 2011 Bradley D. Seago.
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xiao, et al "Nested Codes With Multiple Interpretations" retrieved from the Internet URL: http://www.ece.nmsu.edu/~jkliewer/paper/XFKC_CISS06 (retrieved on Dec. 5, 2012).
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. On Information Theory, vol. 57, No. 10 (Oct. 2011).
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong, "Block-LDPC: A Practical LDPC Coding System Design Approach", IEEE Trans. On Circuits, Regular Papers, vol. 5, No. 4, pp. 766-775, Apr. 2005.

\* cited by examiner

SYSTEMS AND METHODS FOR THROUGHPUT ENHANCED DATA DETECTION IN A DATA PROCESSING CIRCUIT

BACKGROUND

Embodiments are related to systems and methods for data processing, and more particularly to systems and methods for efficiency improved data detection.

Various data transfer systems have been developed including storage systems, cellular telephone systems, radio transmission systems. In each of the systems data is transferred from a sender to a receiver via some medium. For example, in a storage system, data is sent from a sender (i.e., a write function) to a receiver (i.e., a read function) via a storage medium. The data processing includes application of a data detection algorithm to a data set to yield a detected output. Such data detection algorithms rely on information from a preceding state to make decisions in a succeeding state. This process can be inefficient.

Hence, for at least the aforementioned reasons, there exists a need in the art for advanced systems and methods for data processing.

BRIEF SUMMARY

Embodiments are related to systems and methods for data processing, and more particularly to systems and methods for efficiency improved data detection.

Some embodiments of the present invention provide data processing systems that include a data detector circuit. The data detector circuit include at least a first pipeline stage and a second pipeline stage, and is operable to: process a first data set through the first pipeline stage to yield a first output, and to process the first output through the second pipeline stage; modify a cumulative metric associated with an entry point of the first pipeline stage; and process a second data set through the first pipeline stage to yield a second output.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Embodiments are related to systems and methods for data processing, and more particularly to systems and methods for efficiency improved data detection.

Various embodiments of the present invention provide memory cancelable data detection circuits. Such data detection circuits apply a data detection algorithm divided into a number of pipelined stages. Thus, a data set is applied to a first pipelined stage, and the result of the first pipelined stage is provided to a second pipelined stage. In one particular embodiment of the present invention, the data detection algorithm is divided across twenty pipeline stages. Based upon the disclosure provided herein, one of ordinary skill in the art will recognize a variety of numbers of stages that may be used in relation to different embodiments of the present invention. Applying the data detection algorithm during the first stage, second stage, and later stages relies on applying information developed during a preceding symbol or bit period for processing during the next symbol or bit period. This use of historical data continues over a defined data set. Once the last stage processing completes for the defined data set, the historical information is canceled or reset and a subsequent defined data set is introduced to the first stage processing. By canceling or resetting the historical information, processing of the subsequent defined data set is not impacted by the preceding defined data set. This same cancellation or resetting of historical data occurs as the succeeding data set completes the first stage processing and the result is introduced to the second and later stages. Again, this avoids impacting the subsequent defined data set by the preceding defined data set.

Some embodiments of the present invention provide data processing systems that include a data detector circuit. The data detector circuit include at least a first pipeline stage and a second pipeline stage, and is operable to: process a first data set through the first pipeline stage to yield a first output, and to process the first output through the second pipeline stage; modify a cumulative metric associated with an entry point of the first pipeline stage; and process a second data set through the first pipeline stage to yield a second output. In some instances of the aforementioned embodiments, modifying the cumulative metric includes resetting the cumulative metric.

In various instances of the aforementioned embodiments, the data detector circuit is operable to process the second data set through the first pipeline stage before completion of processing the first output through the second pipeline stage. In one or more instances of the aforementioned embodiments, the data detector circuit is operable to begin processing the second data set through the first pipeline stage before completion of processing the first output through the first pipeline stage.

In some instances of the aforementioned embodiments, the cumulative metric is a first cumulative metric, and the data processing system is further operable to: modify a second cumulative metric associated with an entry point of the second pipeline stage; and process the second output through the second pipeline stage. In some such instances, modifying the second cumulative metric includes resetting the second cumulative metric. In one or more such instances, the data detector circuit is operable to begin processing the second data set through the second pipeline stage before completion of processing the first output through the second pipeline stage.

Other embodiments of the present invention provide methods for data processing that include: receiving a first data set by a data detector circuit having at least a first pipeline stage and a second pipeline stage; processing the first data set through the first pipeline stage to yield a first output; processing the first output through the second pipeline stage to yield a second output; receiving a second data set; modifying a cumulative metric associated with an entry point of the first pipeline stage; and processing the second data set through the first pipeline stage to yield a third output.

Figure 1:
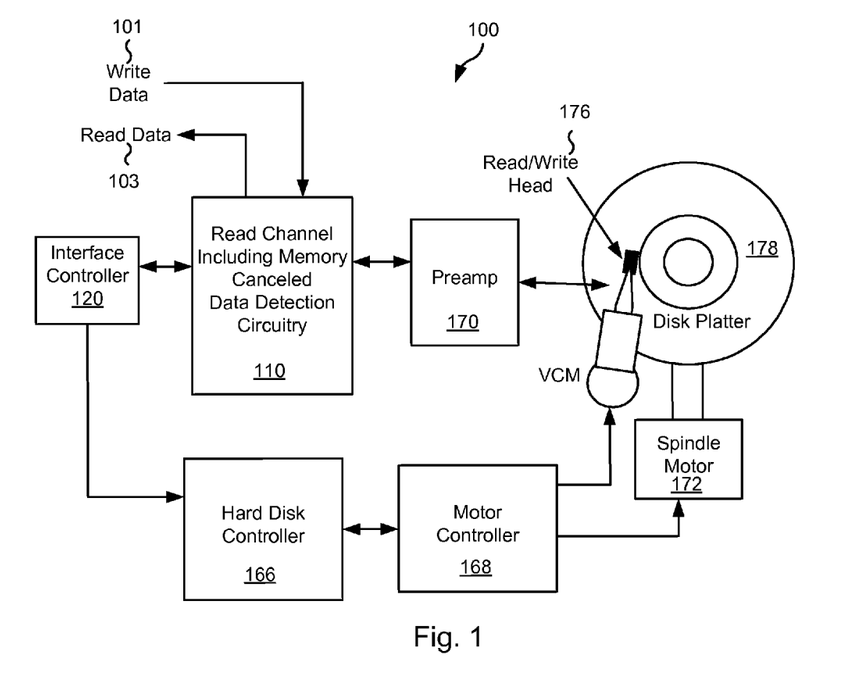
FIG. 1 shows a storage system including memory canceled data detection circuitry in accordance with various embodiments of the present invention.

Turning to FIG. 1, a storage system 100 including a read channel circuit 110 having memory canceled data detection circuitry is shown in accordance with various embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178, and interacts with a host controller 190 that includes out of order constraint command circuitry. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

As part of processing the received information, read channel circuit 110 applies a data detection algorithm to the received data set to yield a detected output. Application of the data detection algorithm is divided into a number of pipelined stages. Thus, a data set is applied to a first pipelined stage, and the result of the first pipelined stage is provided to a second pipelined stage. In one particular embodiment of the present invention, the data detection algorithm is divided across twenty pipeline stages. Based upon the disclosure provided herein, one of ordinary skill in the art will recognize a variety of numbers of stages that may be used in relation to different embodiments of the present invention. Applying the data detection algorithm during the first stage, second stage, and later stages relies on applying information developed during a preceding symbol or bit period for processing during the next symbol or bit period. This use of historical data continues over a defined data set. Once the first stage processing completes for the defined data set, the historical information is canceled or reset and a subsequent defined data set is introduced to the first stage processing. By canceling or resetting the historical information, processing of the subsequent defined data set is not impacted by the preceding defined data set. This same cancellation or resetting of historical data occurs as the succeeding data set completes the first stage processing and the result is introduced to the second and later stages. Again, this avoids impacting the subsequent defined data set by the preceding defined data set. In some cases, the read channel circuit may be implemented similar to that discussed in relation to FIGS. 3a, 3b, and 3d below; and/or may operate similar to the methods discussed below in relation to FIGS. 4a-4b.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platted 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
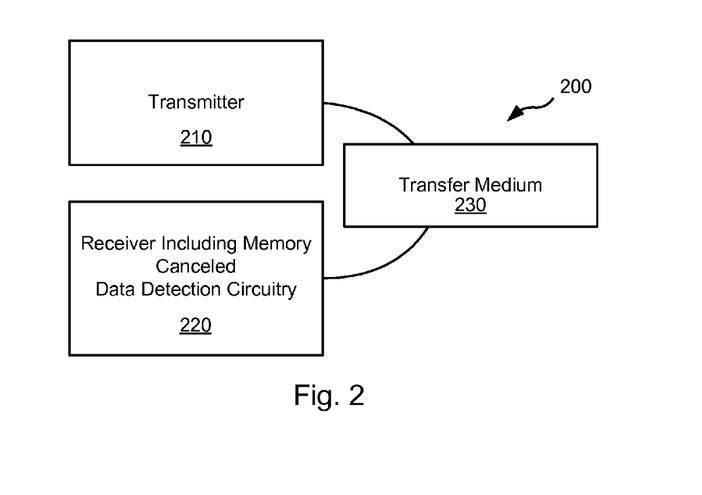
FIG. 2 depicts a data transmission system including memory canceled data detection circuitry in accordance with one or more embodiments of the present invention.

Turning to FIG. 2, a data transmission system 200 including a receiver 220 having memory canceled data detection circuitry is shown in accordance with various embodiments of the present invention. Data transmission system 200 includes a transmitter 210 that is operable to transmit encoded information via a transfer medium 230 as is known in the art. The encoded data is received from transfer medium 230 by a receiver 220. Receiver 220 processes the received input to yield the originally transmitted data.

As part of processing the received information, receiver 200 applies a data detection algorithm to the received data set to yield a detected output. Application of the data detection algorithm is divided into a number of pipelined stages. Thus, a data set is applied to a first pipelined stage, and the result of the first pipelined stage is provided to a second pipelined stage. In one particular embodiment of the present invention, the data detection algorithm is divided across twenty pipeline stages. Based upon the disclosure provided herein, one of ordinary skill in the art will recognize a variety of numbers of stages that may be used in relation to different embodiments of the present invention. Applying the data detection algorithm during the first stage, second stage, and later stages relies on applying information developed during a preceding symbol or bit period for processing during the next symbol or bit period. This use of historical data continues over a defined data set. Once the first stage processing completes for the defined data set, the historical information is canceled or reset and a subsequent defined data set is introduced to the first stage processing. By canceling or resetting the historical information, processing of the subsequent defined data set is not impacted by the preceding defined data set. This same cancellation or resetting of historical data occurs as the succeeding data set completes the first stage processing and the result is introduced to the second and later stages. Again, this avoids impacting the subsequent defined data set by the preceding defined data set. In some cases, the read channel circuit may be implemented similar to that discussed in relation to FIGS. 3a, 3b, and 3d below; and/or may operate similar to the methods discussed below in relation to FIGS. 4a-4b.

Figure 3A:
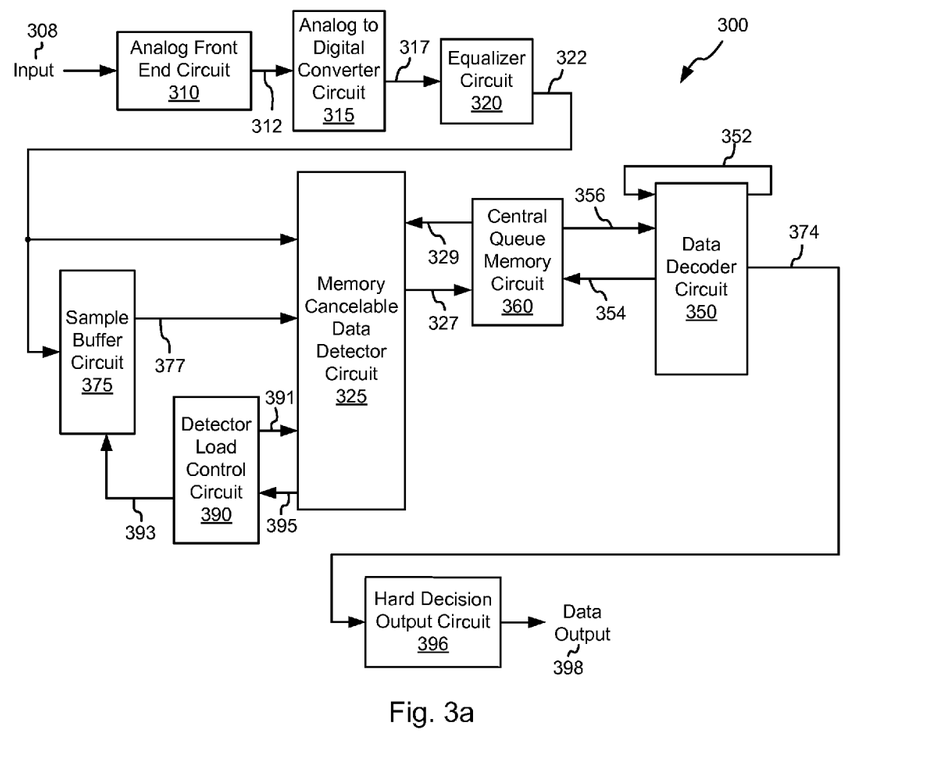
FIG. 3a shows a data processing circuit including a memory cancelable data detection circuit in accordance with some embodiments of the present invention.

FIG. 3a shows a data processing circuit 300 including a memory cancelable data detection circuit 325 in accordance with some embodiments of the present invention. Data processing circuit 300 includes an analog front end circuit 310 that receives an analog signal 308. Analog front end circuit 310 processes analog signal 308 and provides a processed analog signal 312 to an analog to digital converter circuit 315. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310. In some cases, analog input signal 308 is derived from a read/write head assembly (not shown) that is disposed in relation to a storage medium (not shown). In other cases, analog input signal 308 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input signal 308 may be derived.

Analog to digital converter circuit 315 converts processed analog signal 312 into a corresponding series of digital samples 317. Analog to digital converter circuit 315 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 317 are provided to an equalizer circuit 320. Equalizer circuit 320 applies an equalization algorithm to digital samples 317 to yield an equalized output 322. In some embodiments of the present invention, equalizer circuit 320 is a digital finite impulse response filter circuit as are known in the art. It may be possible that equalized output 322 may be received directly from a storage device in, for example, a solid state storage system. In such cases, analog front end circuit 310, analog to digital converter circuit 315 and equalizer circuit 320 may be eliminated where the data is received as a digital data input. Equalized output 322 is stored to a sample buffer circuit 375 that includes sufficient memory to maintain one or more codewords until processing of that codeword is completed through memory cancelable data detector circuit 325 and a data decoder circuit 350 including, where warranted, multiple "global iterations" defined as passes through both data detector circuit 325 and data decoder circuit 350 and/or "local iterations" defined as passes through data decoding circuit 350 during a given global iteration. Sample buffer circuit 375 stores the received data as buffered data 377.

Memory cancelable data detector circuit 325 is a data detector circuit capable of producing a detected output 327 by applying a data detection algorithm to a data input, and capable of modifying or resetting feedback elements of one or more pipeline stages at data set boundaries. As some examples, the data detection algorithm may be but is not limited to, a Viterbi algorithm detection algorithm or a maximum a posteriori detection algorithm as are known in the art. Based upon the disclosure provided herein, one of ordinary skill in the art will recognize a variety of data detection algorithms that may be used in relation to different embodiments of the present invention. Memory cancelable detected output 325 may provide both hard decisions and soft decisions. The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present invention.

A detector load control circuit 390 controls the transition from completing a preceding data set received as buffered data 377 and being processed by memory cancelable detected output 325 and a next data set in sample buffer circuit 375. The transition between the preceding and next data sets is referred to as a data set boundary. In particular, memory cancelable data detector circuit 325 applies a data detection algorithm that has been divided into pipeline stages. Thus, a data set is applied to a first pipelined stage, and the result of the first pipelined stage is provided to a second pipelined stage. In one particular embodiment, the data detection algorithm is divided across twenty pipeline stages. Based upon the disclosure provided herein, one of ordinary skill in the art will recognize a variety of numbers of stages that may be used in relation to different embodiments of the present invention. As the preceding data set completes processing in the first stage pipeline, memory cancelable data detector circuit 325 asserts a completion flag 395 to detector load control circuit 390. In response, detector load control circuit 390 asserts a new data load signal 393 to sample buffer circuit 375 that causes the next data set to be provided as buffered data 377 to memory cancelable data detector circuit 325.

In addition, detector load control circuit 390 asserts a stage reset output 391 to memory cancelable data detector circuit 325 at the data set boundary of any pipeline stage involving feedback. Such assertion of stage reset output 391 causes cancellation or resetting of the history (i.e., feedback) developed during the particular pipeline stage processing of the preceding data set. By doing this, data sets may be introduced to and processed by memory cancelable data detector circuit 325 without awaiting completion of application of all pipeline stages of the data detection algorithm to a preceding data set.

Detected output 327 is provided to a central queue memory circuit 360 that operates to buffer data passed between memory cancelable data detector circuit 325 and data decoder circuit 350. When data decoder circuit 350 is available, data decoder circuit 350 receives detected output 327 from central queue memory 360 as a decoder input 356. Data decoder circuit 350 applies a data decoding algorithm to decoder input 356 in an attempt to recover originally written data. The result of the data decoding algorithm is provided as a decoded output 354. Similar to detected output 327, decoded output 354 may include both hard decisions and soft decisions. For example, data decoder circuit 350 may be any data decoder circuit known in the art that is capable of applying a decoding algorithm to a received input. Data decoder circuit 350 may be, but is not limited to, a low density parity check decoder circuit or a Reed Solomon decoder circuit as are known in the art. Based upon the disclosure provided herein, one of ordinary skill in the art will recognize a variety of data decoder circuits that may be used in relation to different embodiments of the present invention. Where the original data is recovered (i.e., the data decoding algorithm converges) or a timeout condition occurs, data decoder circuit 350 provides the result of the data decoding algorithm as a data output 374. Data output 374 is provided to a hard decision output circuit 396 where the data is reordered before providing a series of ordered data sets as a data output 398.

One or more iterations through the combination of memory cancelable data detector circuit 325 and data decoder circuit 350 may be made in an effort to converge on the originally written data set. As mentioned above, processing through both the data detector circuit and the data decoder circuit is referred to as a "global iteration". For the first global iteration, memory cancelable data detector circuit 325 applies the data detection algorithm without guidance from a decoded output. For subsequent global iterations, memory cancelable data detector circuit 325 applies the data detection algorithm to buffered data 377 as guided by decoded output 354. Decoded output 354 is received from central queue memory 360 as a detector input 329.

During each global iteration it is possible for data decoder circuit 350 to make one or more local iterations including application of the data decoding algorithm to decoder input 356. For the first local iteration, data decoder circuit 350 applies the data decoder algorithm without guidance from a decoded output 352. For subsequent local iterations, data decoder circuit 350 applies the data decoding algorithm to decoder input 356 as guided by a previous decoded output 352. In some embodiments of the present invention, a default of ten local iterations is allowed for each global iteration.

Figure 3B:
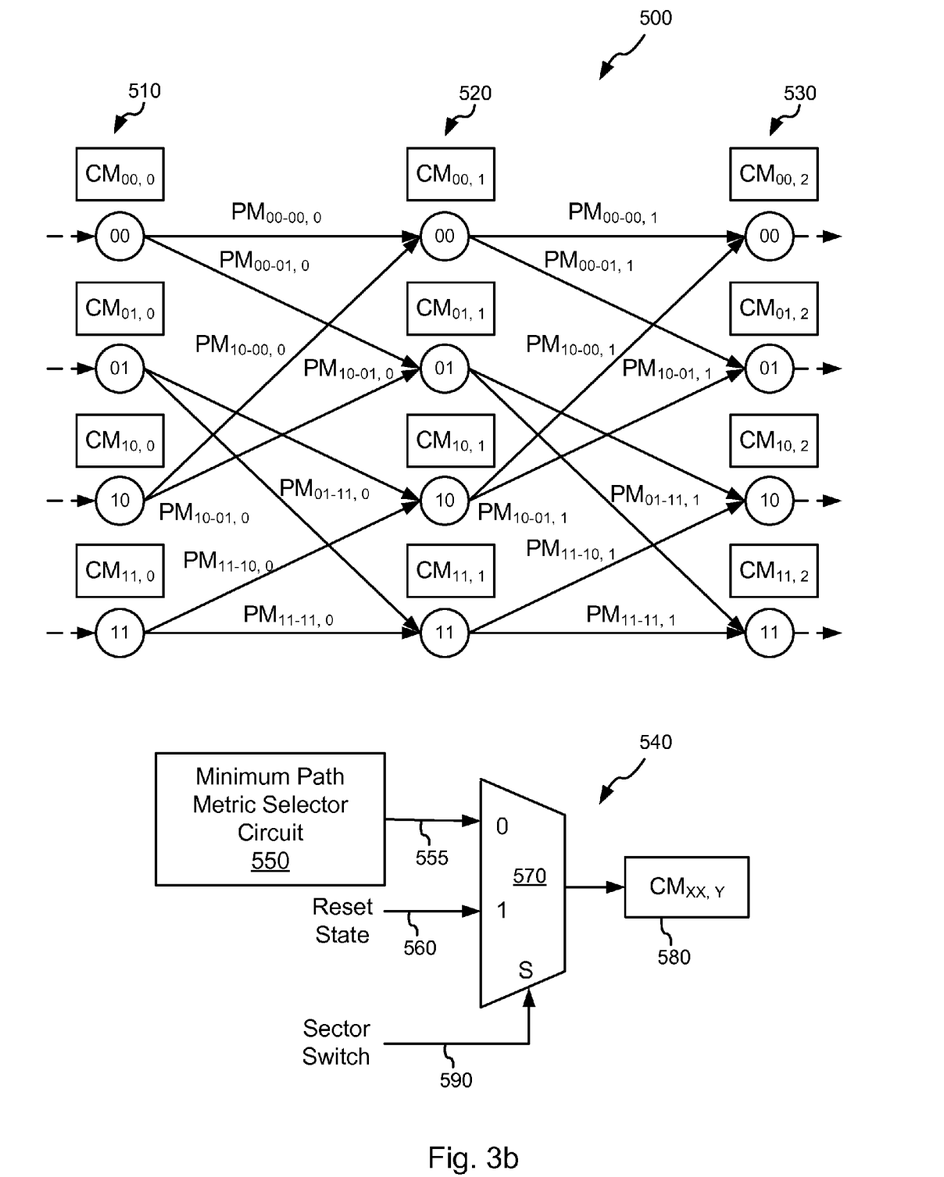
FIG. 3b shows a portion of a trellis diagram representing the data detection circuit of FIG. 3a, and one implementation of a memory cancellation circuit that may be used in relation to the memory cancelable data detection circuit in accordance with one or more embodiments of the present invention.

Turning to FIG. 3b, a portion 500 of a trellis diagram representing memory cancelable data detection circuit 325 of FIG. 3a, and one implementation of a memory cancellation circuit 540 that may be used in relation to memory cancelable data detection circuit 500 in accordance with one or more embodiments of the present invention. Of note, the trellis diagram represents the algorithm being applied by memory cancelable data detector circuit 325. The pipelines discussed below in relation to FIG. 3d represents the hardware implementation of memory cancelable data detector circuit 325 that implements the algorithm represented by the trellis diagram. It should be noted that the trellis section stages are not the same as pipeline stages.

As shown, portion 500 shows three trellis section stages 510, 520, 530 each with four possible states (represented by circles and identified as states '00', '01', '10', and '11', respectively). In addition, a cumulative metric (represented by a rectangle with a notation CMxx, x, respectively) is associated with each of the respective states. In particular, a cumulative metric $CM_{00,0}$ is the cumulative metric associated with state '00' of trellis section stage 510 (also referred to as stage 0); a cumulative metric $CM_{01,0}$ is the cumulative metric associated with state '01' of trellis section stage 510; a cumulative metric $CM_{10,0}$ is the cumulative metric associated with state '10' of trellis section stage 510; a cumulative metric $CM_{11,0}$ is the cumulative metric associated with state '11' of trellis section stage 510; a cumulative metric $CM_{00,1}$ is the cumulative metric associated with state '00' of trellis section stage 520 (also referred to as stage 1); a cumulative metric $CM_{01,1}$ is the cumulative metric associated with state '01' of trellis section stage 520; a cumulative metric $CM_{10,1}$ is the cumulative metric associated with state '10' of trellis section stage 520; a cumulative metric $CM_{11,1}$ is the cumulative metric associated with state '11' of trellis section stage 520; a cumulative metric $CM_{00,2}$ is the cumulative metric associated with state '00' of trellis section stage 530 (also referred to as stage 2); a cumulative metric $CM_{01,2}$ is the cumulative metric associated with state '01' of trellis section stage 530; a cumulative metric $CM_{10,2}$ is the cumulative metric associated with state '10' of trellis section stage 530; and a cumulative metric $CM_{11,2}$ is the cumulative metric associated with state '11' of trellis section stage 530. The aforementioned cumulative metrics are examples of the feedback elements discussed above in relation to FIG. 3a.

In operation, memory cancelable data detector circuit 325 selects transitions between respective states in succeeding trellis section stages based in part on the value maintained as cumulative metric (CMxx, x). In particular, it is determined whether a transition from state '00' of trellis section stage 0 will go to state '01' or state '00' of trellis section stage 1. This determination is based on a comparison of path metrics (PMxx, x) between the states. Using a particular example, the path metric for the path between state '00' of trellis section stage 0 and state '00' of trellis section stage 1 (noted as $PM_{00-00,0}$), and the path metric for the path between state '00' of stage 0 and state '01' of trellis section stage 1 (noted as $PM_{00-01,0}$) are calculated as a sum of a cumulative metric (CM) and a branch metric (BM) in accordance with the respective equations:

$$PM_{00-00,0} = CM_{00,0} + BM_{00,0}; \text{and}$$

$$PM_{00-01,0} = CM_{00,0} + BM_{01,0}.$$

The lowest value path metric determines the subsequent state. Using the example above, where $PM_{00-00,0}$ is less than $PM_{00-01,0}$ then the next state from state '00' of trellis section stage 0 is state '00' of trellis section stage 1. Otherwise, the next state from state '00' of trellis section stage 0 is state '01' of trellis section stage 1.

The cumulative metric for the next state is the minimum path metric leading to that state in the succeeding trellis section stage. Using state '00' of stage 1 as an example, the cumulative metric ($CM_{00,1}$) is set equal to the lesser of the path metric leading from state '01' of trellis section stage 0 (i.e., $PM_{10-00,0}$) or path metric leading from state '00' of trellis section stage 0 (i.e., $PM_{00-00,0}$). This cumulative metric is used to calculate path metrics that will govern transition from trellis section stage 1 to trellis section stage 2. Thus, the path metric governing transitions from a current state to a future state is based upon information developed prior to the current state (i.e., historic or feedback data). This historic pr feedback information relates across a defined data set that has been encoded together (e.g., a sector of data), but is not to be incorporated into application of another separately encoded defined data set (e.g., another sector of data).

To avoid propagating information from the previously processing data set to a subsequently processed data set, the cumulative metrics for the states are canceled or reset at the data set boundary. This process may be done by any of a number of circuits. One implementation of a memory cancellation circuit 540 is shown that may be used in relation to the memory cancelable data detection circuit in accordance with one or more embodiments of the present invention. Memory cancellation circuit 540 has a minimum path metric selector circuit 550 that selects the minimum value for all path metrics leading to the state to which a respective cumulative memory is associated (e.g., for state '11' of trellis section stage 1, minimum path metric selector circuit 550 selects the minimum value of $PM_{00-11,0}$ and $PM_{11-11,0}$). The selected minimum value is provided as a path value 555 to a selector circuit 570. When a new data set is being introduced to a given pipeline stage of memory cancelable data detector circuit 325, a sector switch 590 is asserted causing the value of a reset state 560 to be stored as the respective cumulative metric 580. Where the same data set is continuing to process, sector switch 590 is de-asserted causing path value 555 to be stored as the respective cumulative metric 580. Cumulative metric 580 (CMxx, y) represents the various cumulative metrics discussed above and included in memory cancelable data detector circuit 325. Canceling the historical data imbedded in the respective cumulative metrics assures that the historical or feedback data that is irrelevant to a subsequently processing data set is set to a reset state prior to introducing a new data set for processing.

Figure 3C:
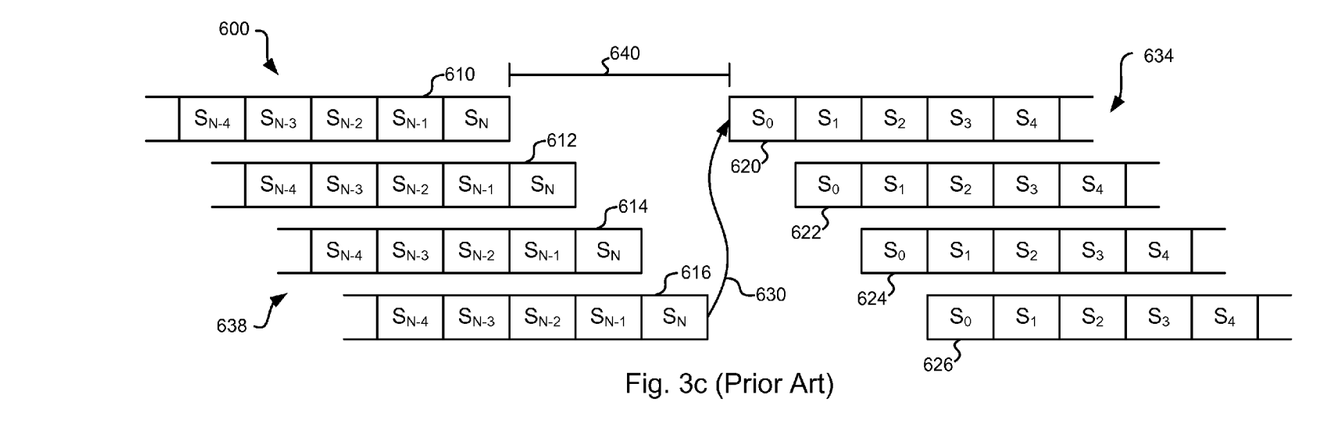
FIG. 3c graphically represents prior art pipelining of a data detection circuit.
Figure 3D:
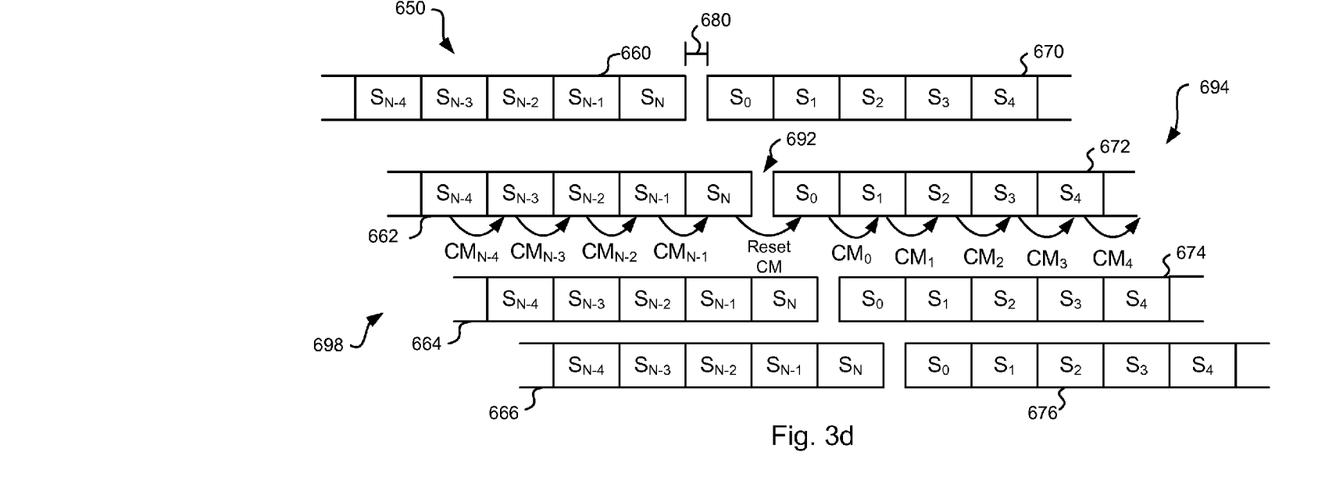
FIG. 3d graphically represents pipelining of a data detection circuit relying on memory cancellation circuitry of the memory cancelable data detection circuit of FIG. 3a in accordance with some embodiments of the present invention.

Turning to FIG. 3c, a graphical representation 600 of a prior art pipelining of a prior art data detection circuit. Graphical representation 600 shows a four stage pipeline where a first data set 638 is processed through four pipeline stages 610, 612, 614, 616, and a second data set 634 processed through four pipeline stages 620, 622, 624, 626. Pipeline stage 610 is the same as pipeline stage 620, except that pipeline stage 610 is processing first data set 638 and pipeline stage 620 is processing second data set 634; pipeline stage 612 is the same as pipeline stage 622, except that pipeline stage 612 is processing first data set 638 and pipeline stage 622 is processing second data set 634; pipeline stage 614 is the same as pipeline stage 624, except that pipeline stage 614 is processing first data set 638 and pipeline stage 624 is processing second data set 634; and pipeline stage 616 is the same as pipeline stage 626, except that pipeline stage 616 is processing first data set 638 and pipeline stage 626 is processing second data set 634. The bits or symbols in first data set 638 and second data set 634 are respectively labeled Sx where x indicates a position within the respective data set. As shown, pipeline stage 620 does not begin until pipeline stage 616 completes as indicated by a connection 630. This delay in starting the next stage of the pipeline is due in part to the retention of historical data from pipeline stage 610 until completion of pipeline stage 616, and results in a significant idle time 640.

Turning to FIG. 3d, a graphical representation 650 of pipelining of memory cancelable data detection circuit 325 in accordance with some embodiments of the present invention. Graphical representation 650 shows a four stage pipeline where a first data set 698 is processed through four pipeline stages 660, 662, 664, 666, and a second data set 694 is processed through four pipeline stages 670, 672, 674, 676. Pipeline stage 660 is the same as pipeline stage 670, except that pipeline stage 660 is processing first data set 698 and pipeline stage 670 is processing second data set 694; pipeline stage 662 is the same as pipeline stage 672, except that pipeline stage 662 is processing first data set 698 and pipeline stage 672 is processing second data set 694; pipeline stage 664 is the same as pipeline stage 674, except that pipeline stage 664 is processing first data set 698 and pipeline stage 674 is processing second data set 694; and pipeline stage 666 is the same as pipeline stage 676, except that pipeline stage 666 is processing first data set 698 and pipeline stage 676 is processing second data set 694.

The bits or symbols in first data set 698 and second data set 694 are respectively labeled Sx where x indicates a position within the respective data set. Pipeline stages 662, 672 each involve feedback where the cumulative metric (CMx) is used in the next step of the pipeline stage. As shown, at a data set boundary 692 between first data set 698 and second data set 694 the feedback (i.e., the cumulative metric) is canceled or reset so that it does not affect the processing of $S_0$ of the next data set. By providing such feedback reset capability, pipeline stage 670 may begin shortly after completion of pipeline stage 660; pipeline stage 672 may begin shortly after completion of pipeline stage 662; pipeline stage 674 may begin shortly after completion of pipeline stage 664; and pipeline stage 676 may begin shortly after completion of pipeline stage 666. This allows for a relatively short idle time 680 where pipeline stage 670 begins well before completion of pipeline stage 666.

Figure 4A:
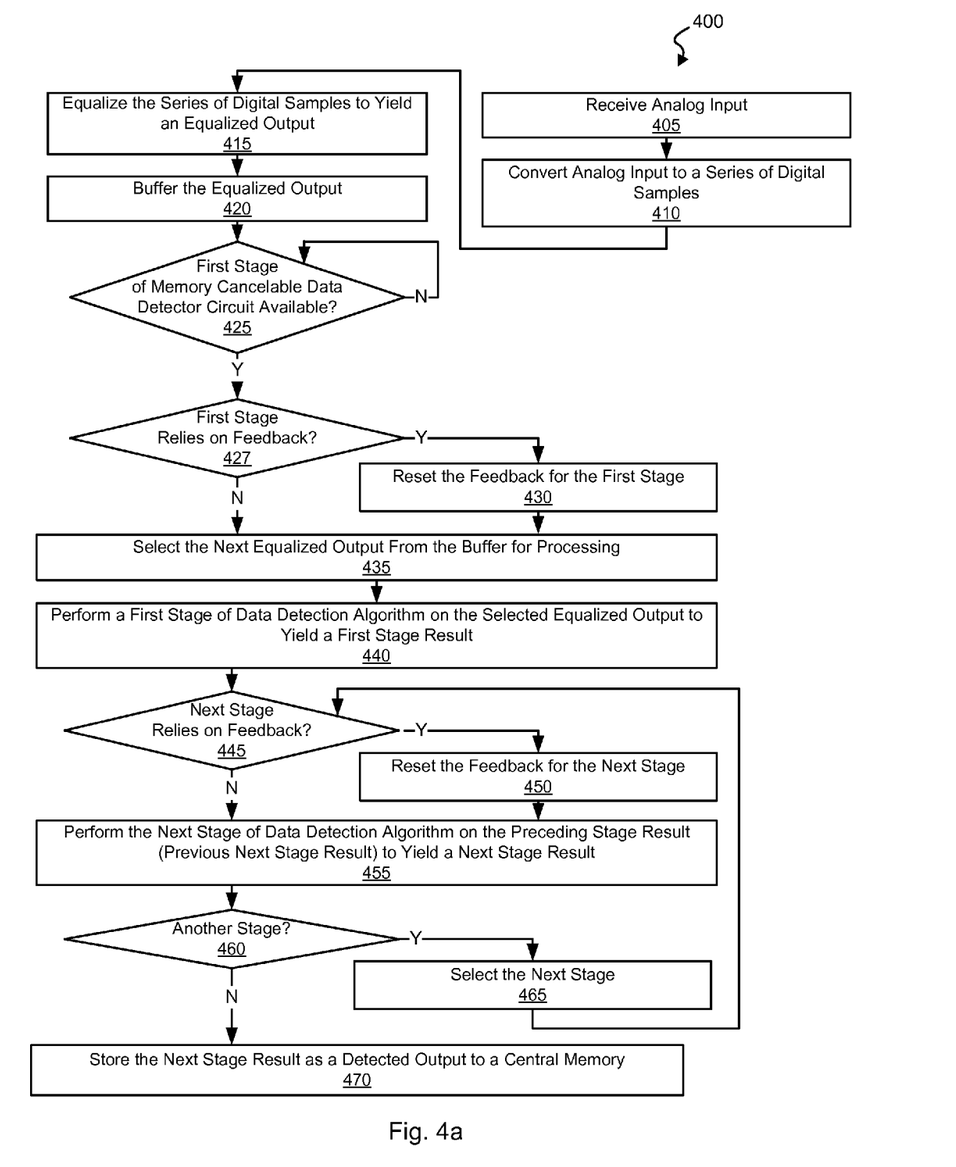
FIGS. 4a-4b are flow diagrams showing a method for data processing relying on memory cancelable data detection in accordance with some embodiments of the present invention.
Figure 4B:
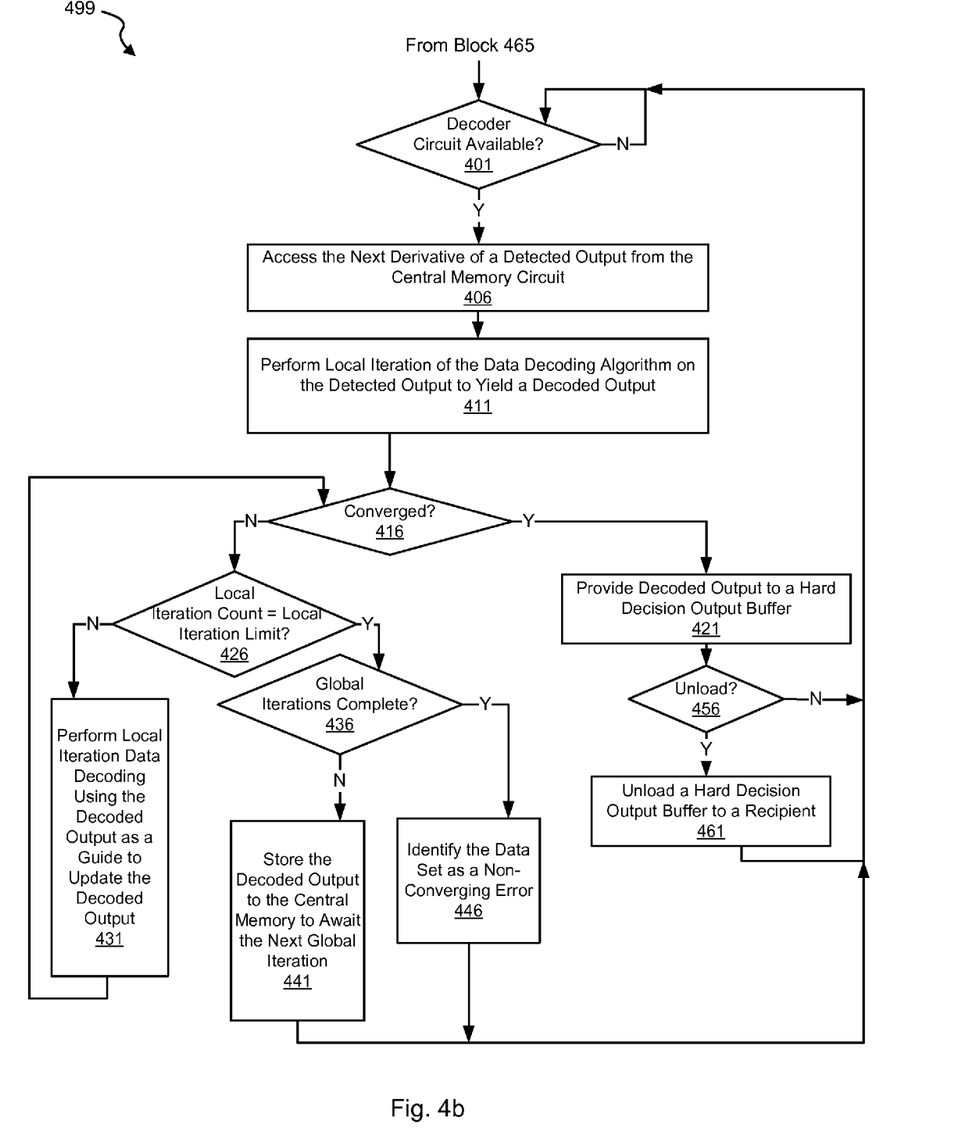

Turning to FIGS. 4a-4b are flow diagrams 400, 499 showing a method for data processing relying on memory cancelable data detection in accordance with some embodiments of the present invention. Following flow diagram 400 of FIG. 4a, an analog input is received (block 405). The analog input may be derived from, for example, a storage medium or a data transmission channel. Based upon the disclosure provided herein, one of ordinary skill in the art will recognize a variety of sources of the analog input. The analog input is converted to a series of digital samples (block 410). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 415). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention. The equalized output is buffered (block 420).

It is determined whether a first pipeline stage of a memory cancelable data detector circuit is available to process a data set (block 425). Where a data detector circuit is available to process a data set (block 425), it is determined whether the first pipeline stage relies on data set specific feedback (e.g., cumulative metrics) (block 427). Where the first pipeline stage does rely on feedback (block 427), the feedback is canceled or reset (block 430). This results in canceling or resetting the feedback at a data set boundary (i.e., a transition between succeeding data sets). Where either the first pipeline stage does not rely on feedback (block 427) or the feedback has been reset (block 430), the next equalized output from the buffer is accessed for processing (block 435). The memory cancelable data detector circuit may be, for example, a Viterbi algorithm data detector circuit or a maximum a posteriori data detector circuit.

A first pipeline stage of the memory cancelable data detector circuit is then performed on the selected equalized output to yield a first stage result (block 440). It is then determined whether the next pipeline stage relies on data set specific feedback (e.g., cumulative metrics) (block 445). Where the next pipeline stage does rely on feedback (block 445), the feedback is canceled or reset (block 450). This results in canceling or resetting the feedback at a data set boundary (i.e., a transition between succeeding data sets). Where either the next pipeline stage does not rely on feedback (block 445) or the feedback has been reset (block 450), the next equalized output from the buffer is accessed for processing (block 455). It is then determined whether another pipeline stage remains to be applied to the data set (block 460). Where another pipeline stage remains (block 460), the next pipeline stage is selected (block 465) and the processes of blocks 445-460 are repeated for the next pipeline stage. Otherwise, where no additional pipeline stages remain (block 460), the last next stage result is stored to a central memory (block 470). By resetting any feedback a data set boundaries or respective pipeline historical from a previously processed data set does not impact the subsequent processing data set allowing the respective pipeline stages to be filled more quickly.

Turning to FIG. 4b and following flow diagram 499, it is determined whether a data decoder circuit is available (block 401) in parallel to the previously described data detection process of FIG. 4a. The data decoder circuit may be, for example, a low density parity check data decoder circuit as are known in the art. Where the data decoder circuit is available (block 401) the next derivative of a detected output is selected from the central queue memory circuit (block 406). The derivative of the detected output may be, for example, an interleaved (shuffled) version of a detected output from the data detector circuit. A first local iteration of a data decoding algorithm is applied by the data decoder circuit to the selected detected output to yield a decoded output (block 411). It is then determined whether the decoded output converged (e.g., resulted in the originally written data as indicated by the lack of remaining unsatisfied checks) (block 416).

Where the decoded output converged (block 416), it is provided as a decoded output codeword to a hard decision output buffer (e.g., a re-ordering buffer) (block 421). It is determined whether the received output codeword is either sequential to a previously reported output codeword in which case reporting the currently received output codeword immediately would be in order, or that the currently received output codeword completes an ordered set of a number of codewords in which case reporting the completed, ordered set of codewords would be in order (block 456). Where the currently received output codeword is either sequential to a previously reported codeword or completes an ordered set of codewords (block 456), the currently received output codeword and, where applicable, other codewords forming an in order sequence of codewords are provided to a recipient as an output (block 461).

Alternatively, where the decoded output failed to converge (e.g., errors remain) (block 416), it is determined whether the number of local iterations already applied equals the maximum number of local iterations (block 426). In some cases, a default seven local iterations are allowed per each global iteration. Based upon the disclosure provided herein, one of ordinary skill in the art will recognize another default number of local iterations that may be used in relation to different embodiments of the present invention. Where another local iteration is allowed (block 426), the data decoding algorithm is applied to the selected data set using the decoded output as a guide to update the decoded output (block 431). The processes of blocks starting at block 416 are repeated for the next local iteration.

Alternatively, where all of the local iterations have occurred (block 426), it is determined whether all of the global iterations have been applied to the currently processing data set (block 436). Where the number of global iterations has not completed (block 436), the decoded output is stored to the central queue memory circuit to await the next global iteration (block 441). Alternatively, where the number of global iterations has completed (block 436), an error is indicated and the data set is identified as non-converging (block 446).

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for out of order data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
   a data detector circuit including at least a first pipeline stage and a second pipeline stage, wherein the data detector circuit is operable to:
      process a first data set through the first pipeline stage to yield a first output, and to process the first output through the second pipeline stage;
      modify a cumulative metric at a data set boundary of the first pipeline stage; and
      process a second data set through the first pipeline stage to yield a second output.

2. The data processing system of claim 1, wherein modifying the cumulative metric includes resetting the cumulative metric.

3. The data processing system of claim 1, wherein the data detector circuit is operable to process the second data set through the first pipeline stage before completion of processing the first output through the second pipeline stage.

4. The data processing system of claim 1, wherein the data detector circuit is operable to begin processing the second data set through the first pipeline stage before completion of processing the first output through the first pipeline stage.

5. The data processing system of claim 1, wherein the cumulative metric is a first cumulative metric, wherein the data processing system is further operable to:
   modify a second cumulative metric associated with an entry point of the second pipeline stage; and
   process the second output through the second pipeline stage.

6. The data processing system of claim 5, wherein modifying the second cumulative metric includes resetting the second cumulative metric.

7. The data processing system of claim 5, wherein the data detector circuit is operable to begin processing the second data set through the second pipeline stage before completion of processing the first output through the second pipeline stage.

8. The data processing system of claim 1, wherein the system is implemented as an integrated circuit.

9. The data processing system of claim 1, wherein the system is implemented as part of device selected from a group consisting of: a storage device, and a communication device.

10. The data processing system of claim 1, wherein the data detector circuit is selected from a group consisting of: a maximum a posteriori data detector circuit, and a Viterbi algorithm data detector circuit.

11. The data processing system of claim 1, wherein processing the first output through the second pipeline stage yields a third output, wherein the data detector circuit is further operable to generate a detected output derived from the third output; and wherein the data processing system further comprises:
   a data decoder circuit operable to apply a data decoding algorithm to a decoder input derived from the detected output to yield a decoded output.

12. The data processing system of claim 11, wherein the data decoder circuit is a low density parity check data decoder circuit.

13. A method for data processing, the method comprising:
   receiving a first data set by a data detector circuit, wherein the data detector circuit includes at least a first pipeline stage and a second pipeline stage;
   processing the first data set through the first pipeline stage to yield a first output;
   processing the first output through the second pipeline stage to yield a second output;
   receiving a second data set;
   modifying a cumulative metric associated with an entry point of the first pipeline stage; and
   processing the second data set through the first pipeline stage to yield a third output.

14. The method of claim 13, wherein processing the second data set through the first pipeline stage begins before completion of processing the first output through the first pipeline stage.

15. The method of claim 13, wherein modifying the cumulative metric includes resetting the cumulative metric.

16. The method of claim 13, wherein processing the second data set through the first pipeline stage begins before completion of processing the first output through the second pipeline stage.

17. The method of claim 13, wherein the cumulative metric is a first cumulative metric, wherein the method further comprises:
   modifying a second cumulative metric associated with an entry point of the second pipeline stage; and
   processing the third output through the second pipeline stage.

18. The method of claim 13, wherein the cumulative metric is a plurality of cumulative metrics, and wherein modifying the cumulative metric associated with the entry point of the first pipeline stage includes resetting each of the plurality of cumulative metrics.

19. A storage device, the storage device comprising:
   a storage medium;
   a head assembly disposed in relation to the storage medium and operable to provide a sensed signal corresponding to a first data set on the storage medium and a second data set on the storage medium
   a read channel circuit including:
      an analog front end circuit operable to provide an analog signal corresponding to the sensed signal;
      an analog to digital converter circuit operable to sample the analog signal to yield a series of digital samples;
      an equalizer circuit operable to equalize the digital samples corresponding to the first data set to yield a first sample set, and to equalize the digital samples corresponding to the second data set to yield a second sample set;
      a data detector circuit including at least a first pipeline stage and a second pipeline stage, wherein the data detector circuit is operable to:
         process the first sample set through the first pipeline stage to yield a first output, and to process the first output through the second pipeline stage;
         modify a cumulative metric associated with an entry point of the first pipeline stage; and
         process the second sample set through the first pipeline stage to yield a second output.

20. The storage device of claim 19, wherein the data detector circuit is operable to process the second sample set through the first pipeline stage before completion of processing the first output through the second pipeline stage.

* * * * *